United States Patent [19]
Lin

[11] Patent Number: 5,362,994
[45] Date of Patent: Nov. 8, 1994

[54] COMPARATOR WITH CONTROLLED HYSTERESIS

[75] Inventor: San L. Lin, San Jose, Calif.

[73] Assignee: Winbond Electronics North America Corporation, San Jose, Calif.

[21] Appl. No.: 959,853

[22] Filed: Oct. 13, 1992

[51] Int. Cl.$^5$ .............................................. H03K 5/24
[52] U.S. Cl. ........................................ 327/72; 327/206
[58] Field of Search .............. 307/355, 356, 358, 359, 307/520, 290, 471, 494; 328/165, 167

[56] References Cited

U.S. PATENT DOCUMENTS

| | | | |
|---|---|---|---|
| 4,536,666 | 8/1985 | Metz et al. ............................ | 307/520 |
| 4,739,189 | 4/1988 | Kellogg .................................. | 328/167 |
| 4,894,620 | 1/1990 | Nagaraj ................................. | 307/520 |
| 4,926,068 | 5/1990 | Fujita ..................................... | 307/359 |
| 5,155,388 | 10/1992 | Corcoran et al. ..................... | 307/355 |

Primary Examiner—Timothy P. Callahan
Assistant Examiner—My-Trang Nu Ton
Attorney, Agent, or Firm—Skjerven, Morrill, MacPherson, Franklin & Friel

[57] ABSTRACT

A hysteresis comparator is disclosed which utilizes an on-chip bias generator, and incorporates circuitry which renders the decision voltages $V_P$ and $V_N$ insensitive to semiconductor process variations, independent of any critical reference voltages, and proportional to absolute temperature. Current sources coupled to positive and negative bias voltages are utilized to generate precise voltages across resistors to set the magnitude of $V_P$ and $V_N$, which magnitudes are set by the ratios of like components existing within the same integrated circuit. Hysteresis comparators with precise and repeatable decision voltages can be implemented while consuming a minimum amount of semiconductor area.

15 Claims, 12 Drawing Sheets

COMPARATOR WITH CONTROLLED HYSTERESIS

BACKGROUND OF THE INVENTION

1. Field of the Invention

The present invention relates to voltage comparators with hysteresis, particularly those suitable for implementation in an integrated circuit.

2. Description of Related Art

Comparators are widely used in a variety of electronic equipment to compare the voltages of two analog inputs, and to provide a digital output. This output is driven high or low by the comparator depending upon which of the inputs is at the higher voltage. Adding hysteresis can be useful in many applications to provide noise immunity and to prevent the output from "chattering" when the inputs hover near the threshold of the comparator.

FIG. 1 shows a representation of a comparator 10 comprising two input leads 11 and 12 and an output lead 13. The differential input voltage $V_{IN}$ is coupled to leads 11 and 12, and output lead 13, which is referenced to comparator reference 14, will be driven high if the voltage coupled to lead 11 is greater than the voltage coupled to lead 12. Conversely, the output lead 13 will be driven low if the voltage coupled to lead 11 is less than the voltage coupled to lead 12.

FIG. 2 illustrates the well-known hysteresis characteristic showing a positive decision voltage $V_P$ and a negative decision voltage $V_N$. In operation, a comparator exhibiting this hysteresis characteristic will require the differential input voltage $V_{IN}$ to exceed the decision voltage $V_P$ before the output of the comparator will be driven high. Subsequently, once output 13 is high, the $V_{IN}$ must drop to a value less than the decision voltage $V_N$ to cause the output to switch low. Circuit advantages can result if the decision voltages $V_P$ and $V_N$ are tightly controlled.

Traditionally, hysteresis in a comparator has been implemented by utilizing a gain stage in the forward path and a hysteresis control block in the feedback path. FIG. 3 shows a hysteresis comparator 10 comprising non-inverting input lead 11, inverting input lead 12 coupled to comparator reference 14, gain stage 21, output lead 13 for providing an output voltage, and hysteresis control block 30. In operation, hysteresis control block 30 responds to the output node 32 of gain stage 21 and provides a voltage level on feedback node 34 which gives rise to the hysteresis characteristic of FIG. 2.

Transistors 21 and 22 and resistors 31 and 33 form a resistive divider which sets the approximate voltage of feedback node 34. Two inverters, comprising transistors 25 and 26 and transistors 23 and 24, drive node 36 high or low corresponding to the output 32 of gain stage 21. Depending on the logic state of node 36, the current through resistor 35 will then pull the voltage of node 34 towards one of the reference voltages $V_{REFP}$ or $V_{REFN}$, coupled to nodes 38 and 39, respectively. If the voltage on node 32 is high, hysteresis control block 30 will produce a higher voltage level on feedback node 34. Similarly, if the voltage on node 32 is low, the hysteresis control block 30 will produce a lower voltage level on feedback node 34. The design equations for this circuit can be written as:

$$1 + \frac{K_1}{(1+K_1)} \frac{R_1}{R_2} = \frac{V_{REFP} - V_{REFN}}{V_P - V_{REFN}} \quad \text{(eq. 1)}$$

and $$1 + \frac{K_2}{(1+K_2)} \frac{R_2}{R_1} = \frac{V_{REFN} - V_{REFP}}{V_N - V_{REFP}} \quad \text{(eq. 2)}$$

where $$R_1 = R_{31} + \frac{1}{g_{ds(21)}}$$

$$R_2 = R_{33} + \frac{1}{g_{ds(22)}}$$

$$K_1 R_1 = R_{35} + \frac{1}{g_{ds(23)}}$$

$$K_2 R_2 = R_{35} + \frac{1}{g_{ds(24)}}$$

and where $$\frac{1}{g_{ds(21)}}, \frac{1}{g_{ds(22)}}, \frac{1}{g_{ds(23)}}, \frac{1}{g_{ds(24)}}$$

are the onresistances of transistors 21, 22, 23, and 24 respectively, and where $R_{31}$, $R_{33}$ and $R_{35}$ are the resistances of respective resistors 31, 33 and 35.

Transistors 21 and 22, which are always on, are included in this circuit to allow better control of $K_1 R_1/R_1$ and $K_2 R_2/R_2$ ratios, and therefore better control of $K_1$ and $K_2$ values.

There are several disadvantages to the circuit of FIG. 3, especially when trying to control the variations of $V_P$ and $V_N$. First, controlling the $R_1/R_2$ value in equations 1 and 2 requires balancing the on-resistance, or $1/g_{ds}$, of an n-channel transistor to that of a p-channel transistor. Because of different processing steps used to fabricate the n-channel and p-channel transistors, this balancing cannot be done by just choosing an appropriate transistor width ratio. The remaining variations in $R_1/R_2$ ratio can be minimized by choosing both large resistors and large transistors (i.e., small $1/g_{ds}$), but both of these choices require a large silicon area to implement.

Secondly, the more profound disadvantage of the circuit of FIG. 3 is the requirement of two critical reference voltages $V_{REFP}$ and $V_{REFN}$. The regulation of these voltages with respect to the comparator reference voltage 14 directly impacts the stability of decision voltages $V_P$ and $V_N$.

Another of form of hysteresis comparator is shown in FIG. 4. A resistor divider comprised of resistors 40 and 42 generates a voltage on node 46 which is either higher or lower than the input voltage coupled directly to lead 11, depending upon whether the comparator output 13 is high or low. To understand the operation of this circuit, assume that the voltage on lead 11 is well below the voltage of lead 12 (by an amount exceeding the magnitude of $V_N$). Gain stage 21 will drive node 13 low, which causes node 48 to also be driven low by the two inverters comprised of transistors 43 and 47 and transistors 41 and 45. Due to the resistive divider, node 46 will be even lower than node 11. Subsequently, when node 11 rises to a voltage high enough to cause the voltage on node 46 to increase above the voltage of node 12, the gain stage will switch to a high state and subsequently cause node 48 to be driven high. This causes the voltage on node 46 to now be much higher than the voltage on lead 11, further reinforcing the high output state of gain stage 21. The design equations for this circuit can be written as:

$$\frac{R_{42} + \frac{1}{g_{ds(45)}}}{R_{40}} = \frac{V_{REFN}}{V_P} \quad \text{(eq. 3)}$$

and $$\frac{R_{42} + \frac{1}{g_{ds(41)}}}{R_{40}} = \frac{V_{REFP}}{V_N} \quad \text{(eq. 4)}$$

In the above equations the quantities $1/g_{ds(41)}$ and $1/g_{ds(45)}$ represent the on-resistances of transistors 41 and 45, respectively.

This circuit suffers from at least two disadvantages. Controlling the resistance ratios in equations 3 and 4 above involve relying on process-dependent resistances of n-channel and p-channel transistors. As before, this effect can be minimized by choosing large resistors and transistors, but this consumes substantial silicon area.

Another disadvantage of this circuit is the requirement for reference voltages $V_{REFP}$ and $V_{REFN}$, and the regulation necessary on these critical references with respect to the comparator reference 14 which is coupled to lead 12.

SUMMARY OF THE INVENTION

A hysteresis comparator in accordance with the present invention does not rely upon critical reference voltages to control the decision voltages $V_P$ and $V_N$. A further advantage of a comparator in accordance with the present invention is not relying on process matching of N channel and P channel transistors for controlling $V_P$ and $V_N$. A still further advantage of a comparator in accordance with the present invention used in an integrated circuit, is providing for the decision voltages $V_P$ and $V_N$ to be independent of semiconductor process parameter variations. Advantageously, the decision voltages $V_P$ and $V_N$ are proportional to absolute temperature.

In one embodiment a hysteresis comparator comprises a high gain circuit having a first input, a second input, and an output responsive to the polarity of a voltage difference across the first and second inputs, and further comprises a resistor circuit. A current source circuit is coupled to the output of the high gain circuit, and is further coupled to the resistor circuit for maintaining across the resistor circuit, independently of semiconductor process variations, a first voltage that is either a first decision voltage or a second decision voltage in accordance with the output of the high gain circuit. Means are included for imposing a second voltage across the first and second inputs of the high gain circuit that is linearly related to an input voltage of the hysteresis comparator and to the first voltage across the resistor circuit.

In another embodiment of the current invention, a hysteresis comparator comprises a gain stage having first and second inputs, and an output which can be driven to either a first state or a second state in response to the voltages present at the first and second inputs. The comparator further comprises a resistor having a first terminal coupled to the first input of the gain stage, and further having a second terminal coupled to a first reference lead. Additionally, a first current source is coupled between a first bias lead and the first terminal of the resistor, and a second current source is coupled between a second bias lead and the first terminal of the resistor.

In an additional embodiment of the current invention, a hysteresis comparator having a first and second decision voltage with respect to a common reference voltage comprises a gain stage having first and second inputs and an output which can be driven either to a first state or a second state in response to the voltages present at the first and second inputs, and a resistor having a first terminal, and further having a second terminal connected to a first reference lead. The comparator further comprises a current source having a first terminal coupled to a first bias lead and having a second terminal coupled to the first terminal of the resistor. A capacitor is provided having a first terminal, and further having a second terminal coupled to the first input of the gain stage. Lastly, the comparator further comprises a first switch means for coupling one of either the inverting or non-inverting input leads to the first terminal of the capacitor, a second switch means for coupling the first terminal of the capacitor to the first reference lead, and a third switch means for coupling the second terminal of the capacitor to the first terminal of the resistor.

In each of these embodiments, the need for precisely controlled positive and negative reference voltages to establish the decision voltages of the hysteresis comparator is eliminated. Instead, positive and negative bias voltages, and current sources providing current flow through a resistor or resistors are used to set the magnitude of the decision voltages. Secondly, the current invention eliminates the variation of the decision voltages caused by semiconductor process variations during manufacture. In the current invention the decision voltages are determined by precise ratios of like components existing within the same integrated circuit, which ratios can be easily and very tightly controlled to provide for accurate setting of the decision voltages. Furthermore, the decision voltages are proportional to absolute temperature only and not to any other quantity that would vary, either over time, or from individual device to device. This allows hysteresis comparators to be fabricated with extremely precise and controllable decision voltages while consuming a minimum amount of semiconductor area to implement. These and other advantages will be made clear throughout the detailed discussion of the preferred embodiments.

DETAILED DESCRIPTION OF THE PREFERRED EMBODIMENTS

Figure 1:
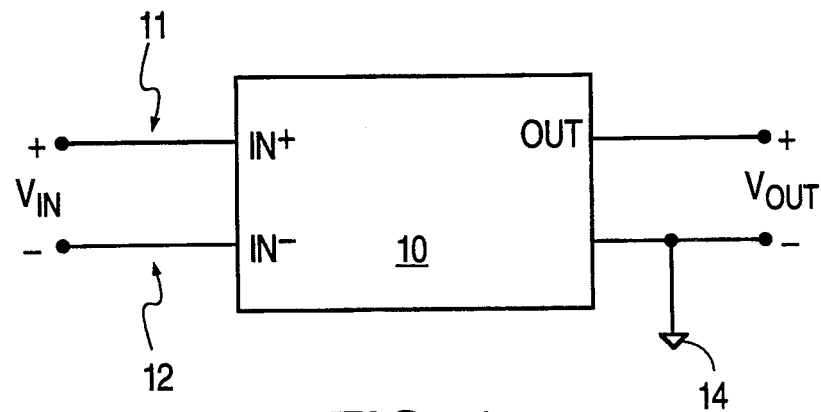
FIG. 1 is a schematic representation of a comparator having a differential input and a single output.
Figure 2:
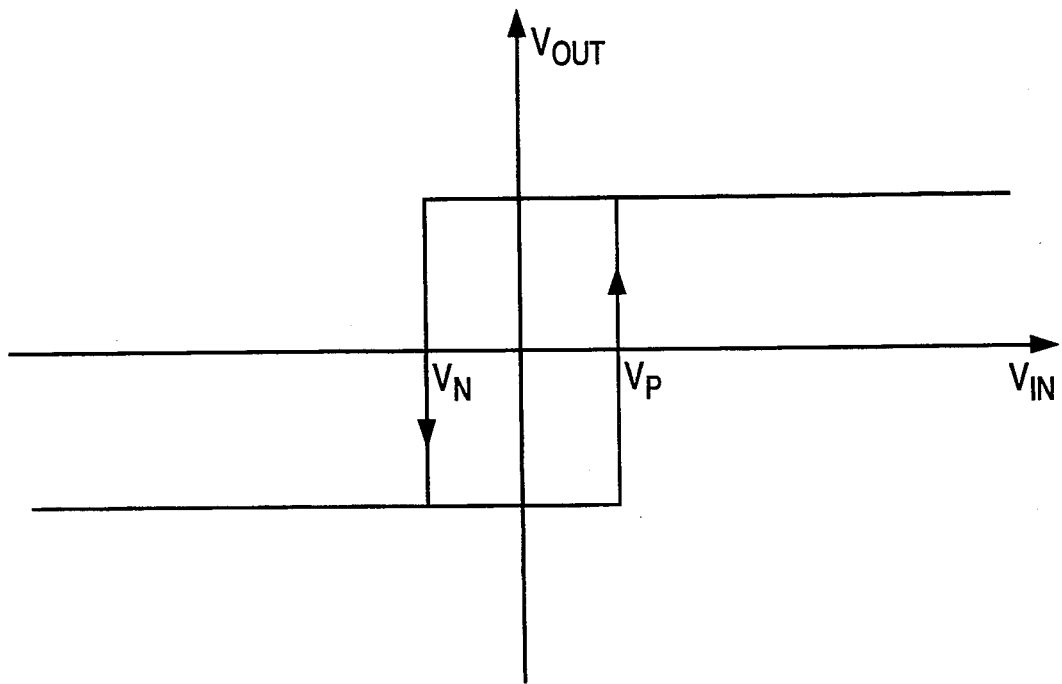
FIG. 2 is a diagram showing the input vs. output relationship of a typical hysteresis comparator with decision voltages $V_P$ and $V_n$.
Figure 5:
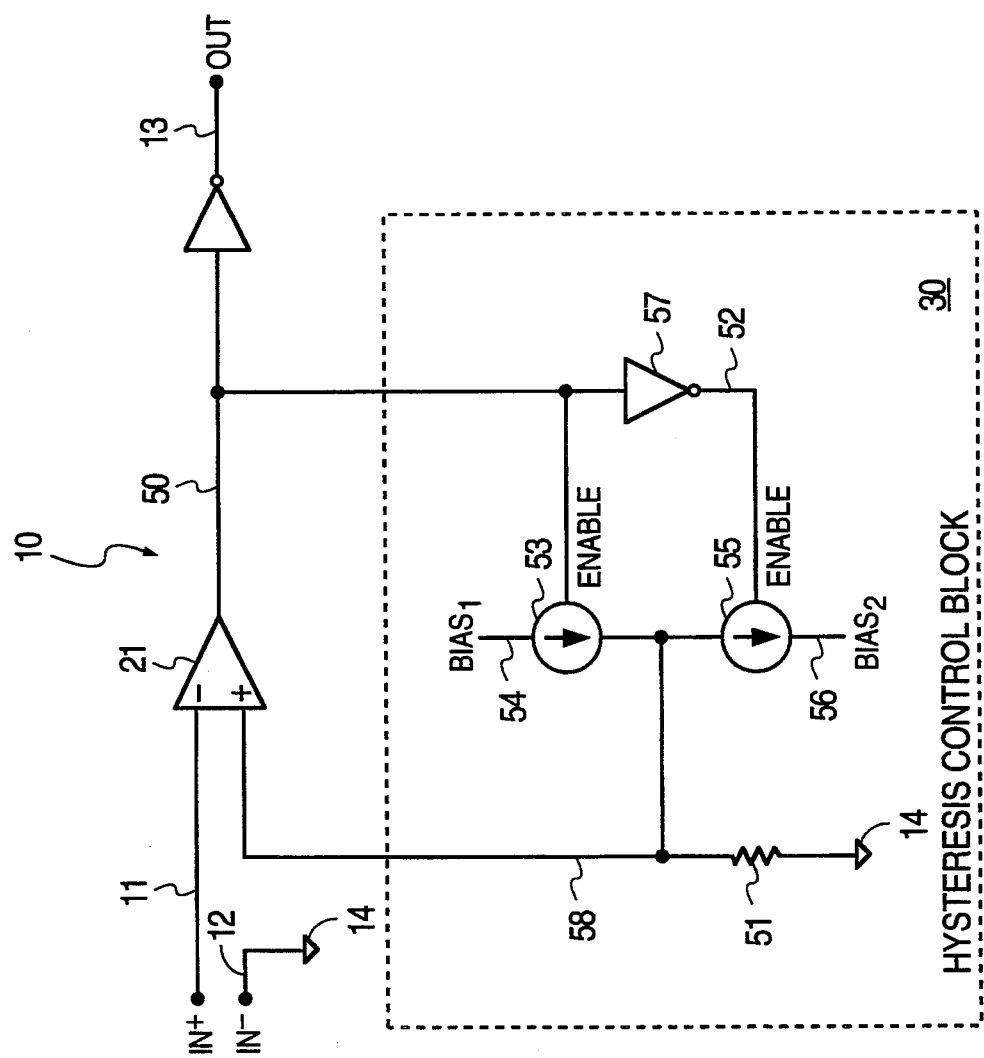
FIG. 5 is a schematic representation of a hysteresis comparator of the current invention, showing a hysteresis control block incorporating two current sources, without the need for precise reference voltages.

FIG. 5 shows a hysteresis comparator 10 comprising a non-inverting input lead 11, an inverting input lead 12, gain stage 21, output lead 13 for providing an output voltage, and hysteresis control block 30. In operation, hysteresis control block 30 responds to the output node 50 of gain stage 21 and provides a voltage level on feedback node 58 which gives rise to the hysteresis characteristic of FIG. 2. Two bias potentials, $BIAS_1$ and $BIAS_2$, are coupled to nodes 54 and 56, respectively. Decision voltages $V_P$ and $V_N$ are determined respectively by the controlled current of either current source 53 or 55, flowing through resistor 51.

To understand the operation of this hysteresis comparator, assume that the voltage coupled to lead 11 is well below (by an amount exceeding the magnitude of $V_N$) the voltage coupled to lead 12, which is connected to comparator reference 14.

Gain stage 21 will respond by driving the voltage on node 50 to a high level, thereby driving the voltage of output lead 13 to a low level. With node 50 at a high level, current source 53 (coupled to the first bias potential, $BIAS_1$) is enabled, while current source 55 is disabled. Because of the direction of the current, $I_{53}$, flowing though resistor 51, a positive voltage will be created at node 58 with respect to comparator reference 14. This reinforces the output high of gain stage 21.

If the voltage coupled to lead 11 is then raised to a point where it exceeds the voltage on node 58, gain stage 21 will respond by driving the voltage of node 50 low, thereby driving the voltage of output node 13 high. Current source 53 becomes disabled while current source 55, coupled to the second bias potential $BIAS_2$, becomes enabled due to inverter 57 driving node 52 high. Because of the direction of current flow of current source 55, a negative voltage will be created at node 58 with respect to comparator reference 14, which further reinforces the output 50 low state of gain stage 21.

Figure 3:
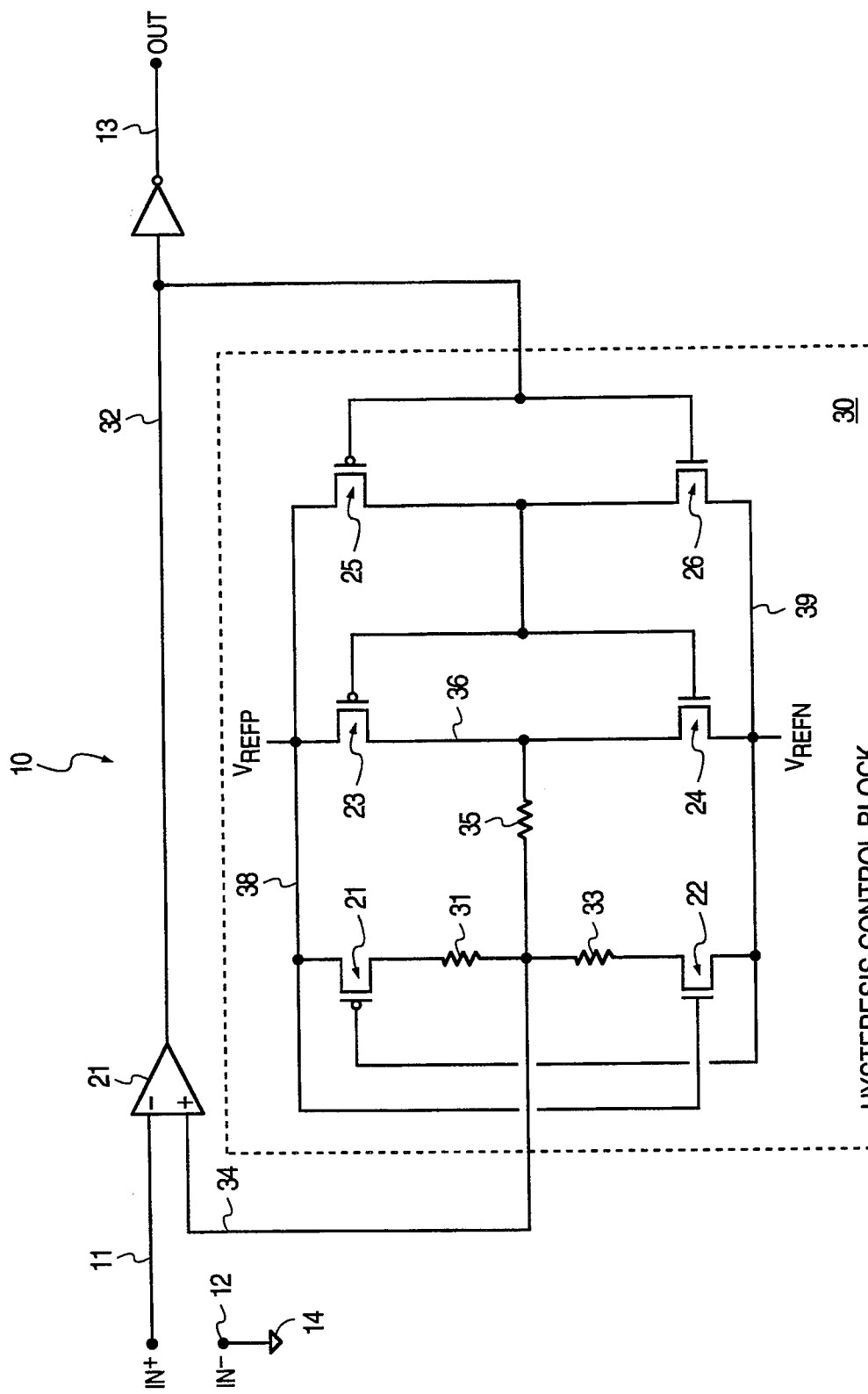
FIG. 3 is a schematic representation of a hysteresis comparator of the type in current use, incorporating a hysteresis control block with positive and negative reference voltages contained therein.
Figure 4:
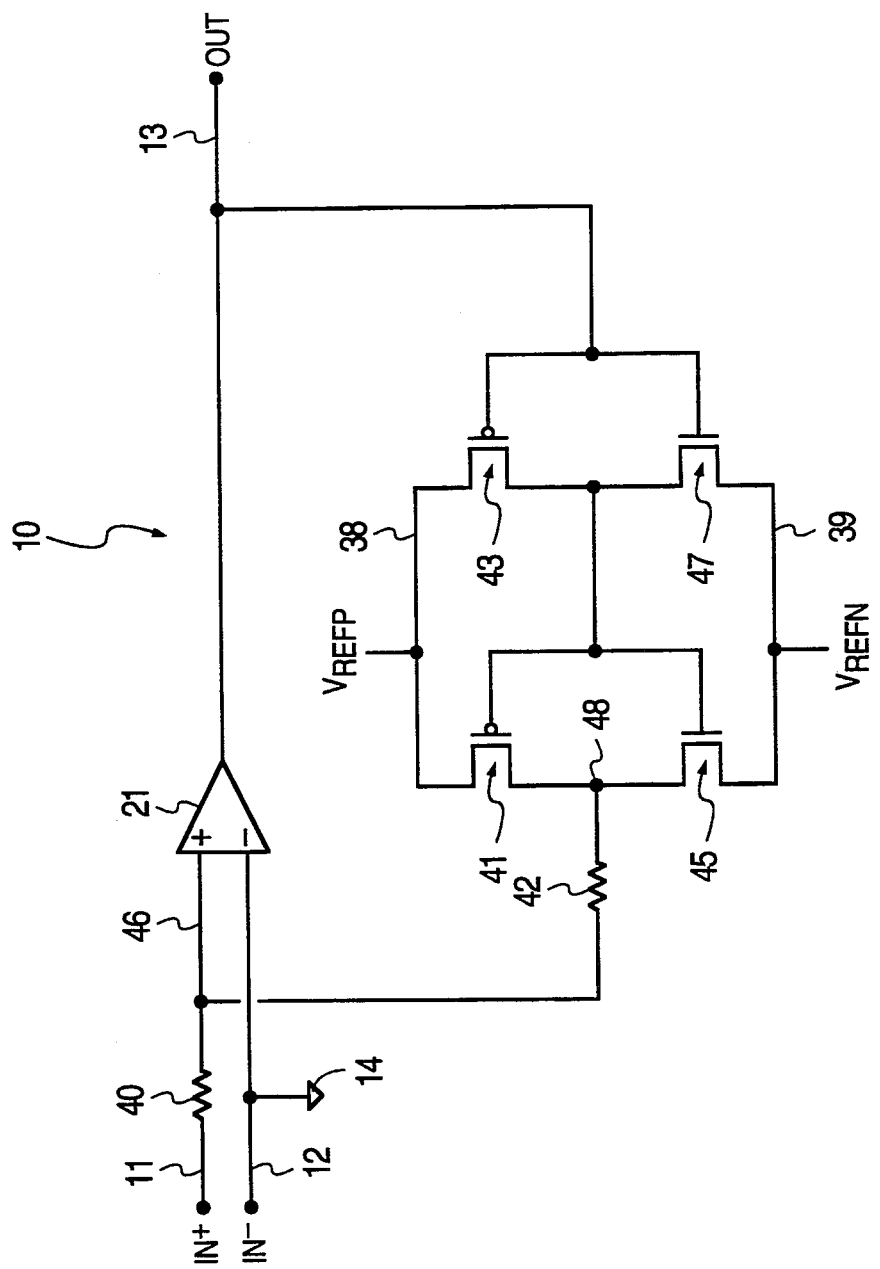
FIG. 4 is a schematic representation of yet another hysteresis comparator in current use.

Since the decision voltages $V_P$ and $V_N$ are each determined by a controlled current flowing through a resistor, the magnitude of the bias voltages coupled to nodes 54 and 56 will not influence $V_P$ and $V_N$. Critical reference voltages, such as $V_{REFP}$ and $V_{REFN}$ of FIGS. 3 and 4, are not needed. As long as the magnitude of current sources 53 and 55 remain controlled, the magnitude of bias voltages $BIAS_1$ and $BIAS_2$ will not affect the decision voltages $V_P$ and $V_N$. (Of course, it may be necessary that the voltage of $BIAS_1$ coupled to node 54 be at least some amount greater than reference voltage 14 when current source 53 is implemented with transistors. Similarly, the voltage of $BIAS_2$ coupled to node 56 typically will be at least some amount less than reference voltage 14 when current source 55 is implemented with transistors.)

While the above description has assumed a gain stage 21 with a continuous time response, a gain stage 21 with a sampled response may also be used, in which case output node 50 will respond to input voltages changes only once per sampling period.

Figure 6:
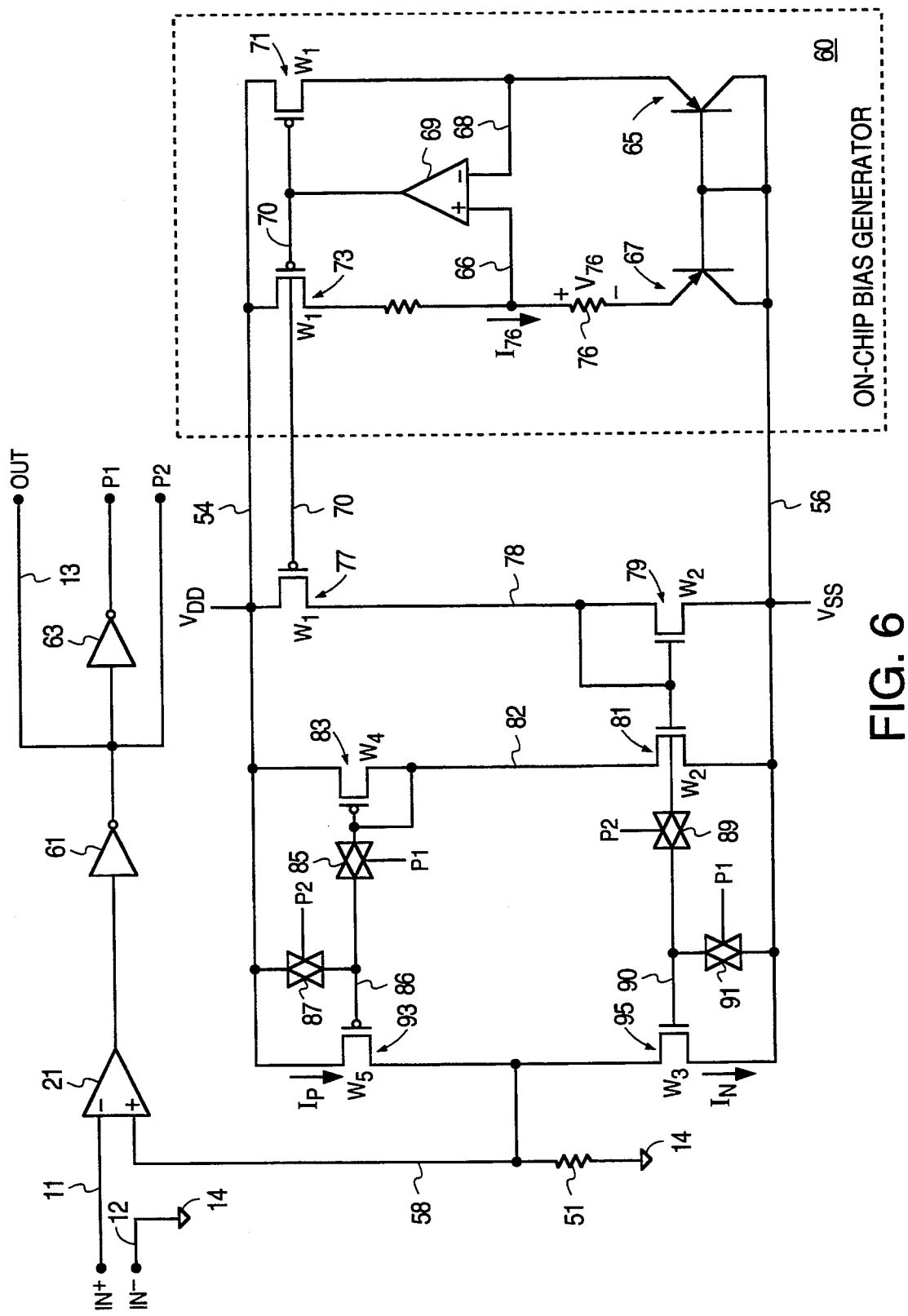
FIG. 6 is a schematic representation of a hysteresis comparator of the current invention, showing a specific embodiment including an on-chip bias generator.

FIG. 6 is a schematic diagram of a hysteresis comparator in accordance with the current invention, which embodies the concepts described in FIG. 5. The specific embodiment of FIG. 6 includes an on-chip bias generator 60, and incorporates circuitry which will render the decision voltages $V_P$ and $V_N$ insensitive to semiconductor process variations, independent of any critical reference voltages, and proportional to absolute temperature. On-chip bias generator 60 forms a reference current source which is typically shared with other circuitry on the same integrated circuit. Power supply voltages $V_{DD}$ and $V_{SS}$ are used as $BIAS_1$ and $BIAS_2$ supplies, respectively.

Transistor 93 forms a current source which, if enabled, will generate a positive voltage at node 58, while transistor 95 forms another current source which, if enabled, will generate a negative voltage at node 58 (with respect to comparator reference 14). Inverters 61 and 63 generate complementary enable signals P1 and P2, responsive to the output state of gain stage 21, which are used to selectively enable either current source transistor 93 or transistor 95.

In order to understand the operation of this circuit, consider first the on-chip bias generator 60. Bipolar transistors 67 and 65 have respective emitter areas of $A_{67}$ and $A_{65}$. Gain element 69 adjusts the voltage of node 70 so that the voltages of nodes 66 and 68 are equilibrated. Matched P-channel transistors 71 and 73, both of width $W_1$ and driven by node 70, source equal currents to transistors 65 and 67, respectively. Thus, the current through resistor 76, $I_{76}$, can be represented as:

$$I_{76} = \frac{V_{76}}{R_{76}} = \frac{\frac{kT}{q} \ln \frac{A_{67}}{A_{65}}}{R_{76}} \qquad \text{(eq. 5)}$$

Since the current through transistor 73, $I_{73}$, is the same current which flows through resistor 76, $I_{73}$ will be equal to $I_{76}$. Transistor 77, also of width $W_1$, is matched to transistor 73 (and to transistor 71) and will conduct a current equal to $I_{R76}$, since it is biased identically to transistor 73 and is the same width.

Transistors 79 and 81, both of width $W_2$, form a current mirror and will cause the current through transistor 81, $I_{81}$, to equal the current through transistor 77, $I_{77}$, which has been shown above to equal $I_{76}$. Transistor 83 is of width $W_4$. Since the current through transistor 83, $I_{83}$, is the same current as flows through transistor 81, $I_{83}$ will also be equal to $I_{76}$.

The two current sources are selectively enabled as follows. When OUT is low, P1 will be high, P2 will be low, transfer gate 85, which is controlled by P1, will couple node 86 to bias node 82, and transfer gate 87 will be off. Transistor 93, of width $W_5$ and biased identically to the biasing of transistor 83, will conduct a current $I_P$ equal to the reference current $I_{76}$ times the ratio of $W_5$ over $W_4$. Transistor 95 remains off as its gate electrode, node 90, is coupled to ground through transfer gate 91 while transfer gate 89 remains off. Therefore, all the current $I_P$ flows through resistor 51, and produces a positive voltage $V_P$ on node 58 (when OUT is low).

Summarizing equations:

$$I_p = \frac{W_5}{W_4} I_{76} \qquad \text{(eq. 6)}$$

$$\frac{V_p}{R_{51}} = \frac{W_5}{W_4} \frac{\frac{kT}{q} \ln \frac{A_{67}}{A_{65}}}{R_{76}} \qquad \text{(eq. 7)}$$

$$V_p = \frac{W_5}{W_4} \frac{R_{51}}{R_{76}} \frac{kT}{q} \ln \frac{A_{67}}{A_{65}} \qquad \text{(eq. 8)}$$

$$V_p = \left[ \frac{W_5}{W_4} \frac{R_{51}}{R_{76}} \frac{k}{q} \ln \frac{A_{67}}{A_{65}} \right] \cdot T \qquad \text{(eq. 9)}$$

In the above equations "k" is Boltzmann's constant, "T" is absolute temperature in degrees Kelvin, and "q" is the electronic charge.

Conversely, when OUT is high, P1 will be low, P2 will be high, transfer gate 87 (controlled by P2) will couple node 86 to $V_{DD}$, thereby turning transistor 93 off. Transfer gate 89 will couple node 90 to bias node 78. Transistor 95, of width $W_3$ and now biased identically to transistor 81, will conduct a current $I_N$ equal to the reference current $I_{76}$ times the ratio of $W_3$ over $W_2$.

Similar equations can be written for $V_N$:

$$I_N = \frac{W_3}{W_2} I_{76} \qquad \text{(eq. 10)}$$

$$-\frac{V_N}{R_{51}} = \frac{W_3}{W_2} \frac{\frac{kT}{q} \ln \frac{A_{67}}{A_{65}}}{R_{76}} \qquad \text{(eq. 11)}$$

$$V_N = -\frac{W_3}{W_2} \frac{R_{51}}{R_{76}} \frac{kT}{q} \ln \frac{A_{67}}{A_{65}} \qquad \text{(eq. 12)}$$

$$V_N = \left[ -\frac{W_3}{W_2} \frac{R_{51}}{R_{76}} \frac{k}{q} \ln \frac{A_{67}}{A_{65}} \right] \cdot T \qquad \text{(eq. 13)}$$

The ratios $$\frac{W_3}{W_2}, \frac{R_{51}}{R_{76}}, \frac{W_5}{W_4}, \text{ and } \frac{A_{67}}{A_{65}}$$

in equations 9 and 13 above can be very well controlled with careful layout techniques, as all are ratios of like components, and are not dependent on absolute values. Since k and q are physical constants, the absolute temperature T is the only non-constant parameter.

Since the equations for $V_P$ and $V_N$ can both be represented as:

$$V_P = \text{(constant)} \, T$$

$$V_N = \text{(constant)} \, T$$

both $V_P$ and $V_N$ are found to be PTAT sources, or "proportional to absolute temperature", and are not dependent on semiconductor process parameters of the circuit components.

In another embodiment, a hysteresis comparator provides for a fully differential input (where neither the non-inverting nor inverting inputs are connected to the comparator reference 14) and uses a gain stage which is sampled and latched. As in the embodiment of FIG. 6 above, the decision voltages $V_P$ and $V_N$ are insensitive to semiconductor process variations, are proportional to absolute temperature, and do not require precision reference voltages. This embodiment, shown in FIG. 10A, uses capacitors to offset the input differential voltage by an amount equal to the decision voltage.

To better understand the embodiment of FIG. 10A, circuit concepts embodied in the hysteresis comparator will be described referring to FIGS. 7, 8, and 9, followed by a detailed description of circuit operation referring specifically to FIG. 10A.

Figure 7:
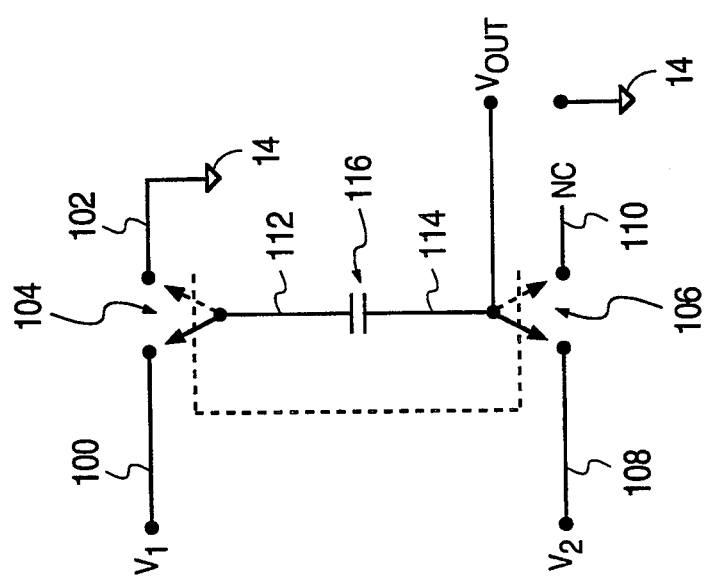
FIG. 7 is a schematic representation of a single capacitor circuit which can be utilized to provide a voltage corresponding to the difference between two analog voltages.

FIG. 7 is a schematic diagram of a circuit utilizing a single capacitor and two switches to provide a voltage corresponding to the difference between two analog voltages. Referring to FIG. 7, output voltage $V_{OUT}$ is generated which corresponds to the difference in input voltage of $V_2$ less $V_1$. Consider the case when switches 104 and 106 are connected in the primary position as shown by the solid connection. Input voltage $V_1$, coupled to node 100, will be coupled to node 112 via switch 104. Likewise input voltage $V_2$, coupled to node 108, will be coupled to node 114 of capacitor 116. The voltage across capacitor 116 is thus the difference in the two input voltages.

When switches 104 and 106 are then thrown to the alternate position (indicated by the dashed connection), node 112 will now be coupled to node 102, which is coupled to the comparator reference 14. Thus, the change in voltage of node 112 is $-V_1$. Since switch 106 now couples node 114 to node 110, which is a no-connect, node 114 is free to be coupled by capacitor 116. Ignoring the effects of stray capacitance on node 114, the change in voltage of node 114 will be equal to the change in voltage of node 112 and will also be $-V_1$. Since the initial voltage (before the switches were thrown) of node 114 was $V_2$, the final voltage on node 114 is $V_2 - V_1$, or $-(V_1 - V_2)$.

Figure 8:
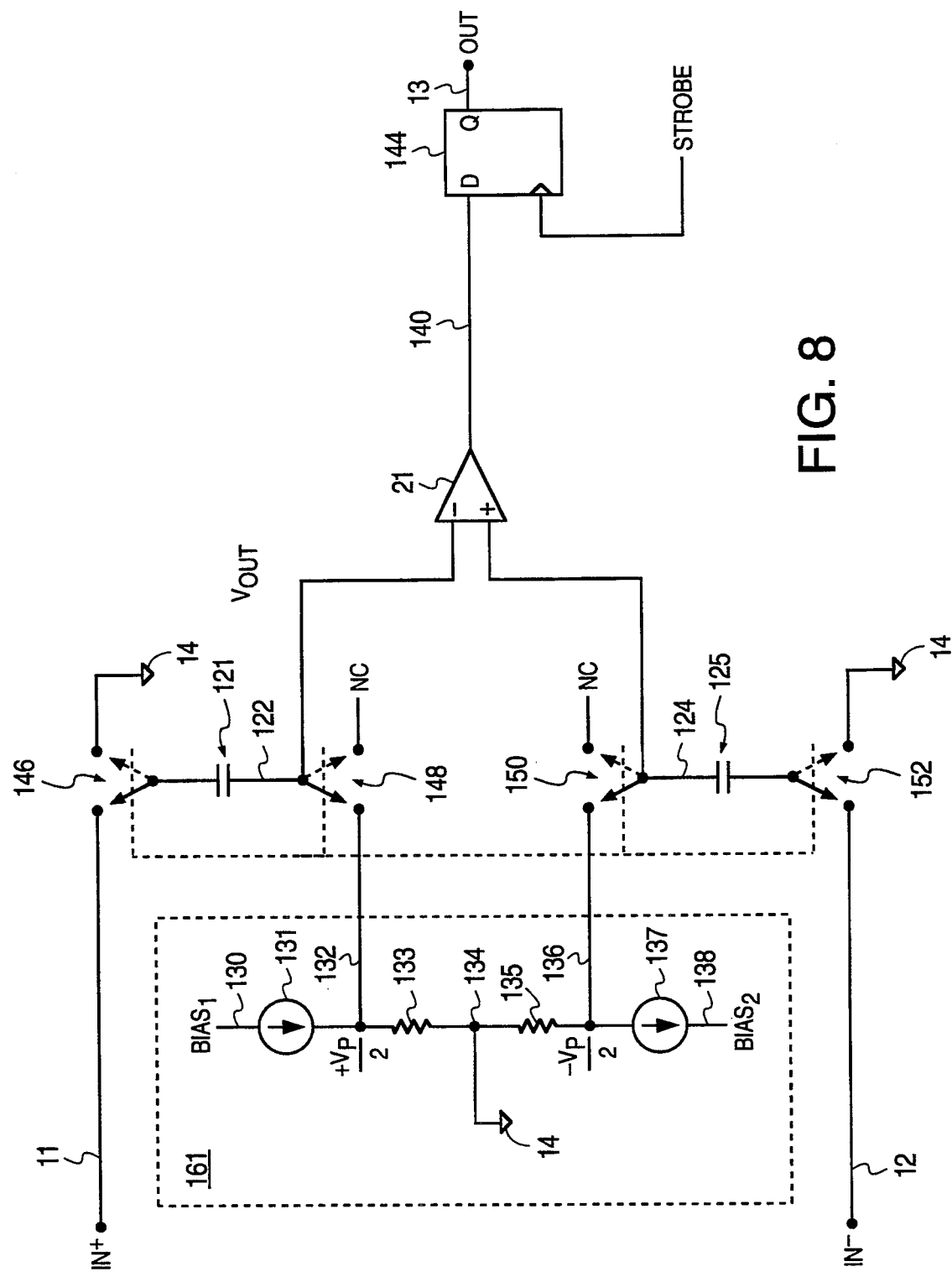
FIG. 8 is a schematic representation of a hysteresis comparator incorporating two of the voltage difference circuits illustrated in FIG. 7.

The comparator of FIG. 8 uses two such capacitor/switch circuits to couple an input differential voltage, offset by an amount corresponding to a decision voltage, to a gain stage 21. Two bias voltages, $BIAS_1$ and $BIAS_2$, are coupled to nodes 130 and 138, respectively. Current source 131 generates a current which flows through resistor 133 to node 134, which is coupled to comparator reference 14. Similarly, current source 137 generates a current which flows from comparator reference 14 through resistor 135. Assume that current source 131 generates a voltage on node 132 equal to $+V_P/2$, and further assume that current source 137 generates a voltage on node 136 equal to $+V_P/2$, both with respect to comparator reference 14.

From the discussion of FIG. 7, capacitor 121 and switches 146 and 148 can be seen to generate a voltage on node 122 (when the switches are thrown to the alternate position equal to $$V_{132} - V_{11} = +\frac{V_p}{2} - IN^+$$

Likewise, capacitor 125 and switches 150 and 152 will generate a voltage on node 124 (again, when the switches are thrown to the alternate position) equal to $$V_{136} - V_{12} = -\frac{V_p}{2} - IN^-.$$

The gain stage 21 will then respond to an input condition equal to:

$$V_{124} - V_{122} = \left(\frac{-V_p}{2} - IN^-\right) - \left(\frac{+V_p}{2} - IN^+\right) = (IN^+ - IN^-) - V_p \quad (14)$$

This represents an output high on node 140 of the gain stage 21 whenever the differential input voltage coupled to nodes 11 and 12 exceeds the decision voltage $V_P$.

When the switches are connected in the primary position, as shown by the solid connection, the input voltages coupled to nodes 11 and 12 are being sampled by capacitors 121 and 125, and the input voltage on gain stage 21 is:

$$V_{124} - V_{122} = -\frac{V_p}{2} - \frac{V_p}{2} = -V_p \quad \text{(eq. 15)}$$

Output 140 of gain stage 21 is latched on the rising edge of STROBE by flip-flop 144, which is useful because the output of gain stage 21 is not necessarily valid at all times of the sampling cycle. Depending upon the implementation of gain stage 21, output 140 may be invalid at certain times when capacitors 121 and 125 are sampling the input voltages.

The discussion of circuit operation for FIG. 8 has assumed that the differential input voltage coupled to nodes 11 and 12 has been below the negative decision voltage $V_N$, and thus sets up gain stage 21 to provide a high output only when the differential input voltage first exceeds the positive decision voltage $V_P$. To correctly adhere to the hysteresis characteristic of FIG. 2, as soon as the sampled differential input voltage exceeds $V_P$, the circuit must change to then respond only to a differential input voltage less than $-V_N$. To accomplish this requires reversing the polarity of the voltages generated on nodes 132 and 136.

Figure 9:
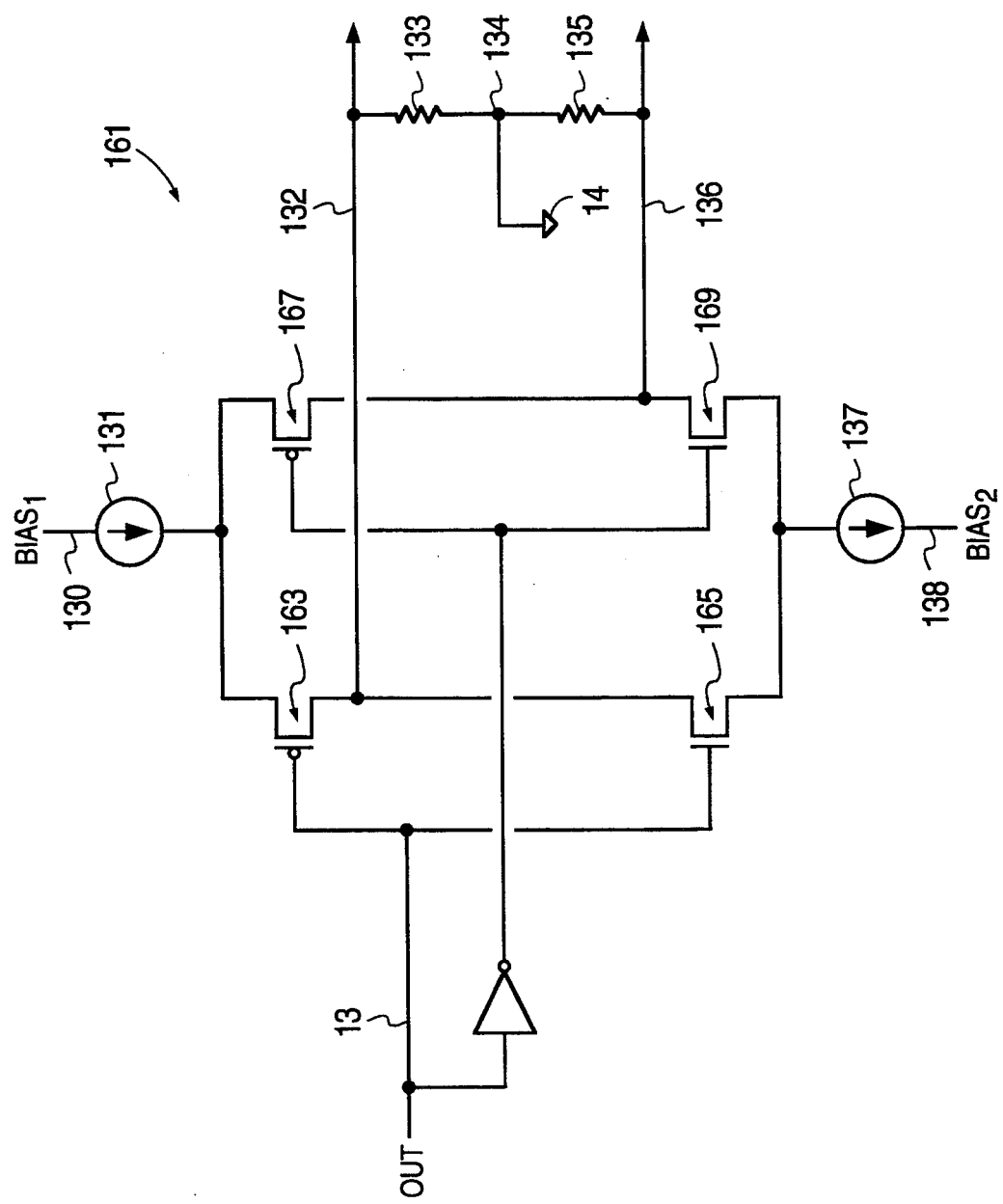
FIG. 9 is a schematic diagram of current-steering circuitry useful to the hysteresis comparator of FIG. 8.

The sub-circuit 161 of FIG. 9, when utilized in conjunction with the circuit of FIG. 8, accomplishes this by using a matrix of four steering transistors which connect each current source to the proper resistor, according to the last state of the latched comparator output, OUT.

To understand its operation, assume the state of OUT is low. Transistor 163 will therefore be on, transistor 165 will be off, and current source 131 will be coupled to node 132 and resistor 133. Since node 162 will be high, current source 137 will be coupled by transistor 169 to node 136 and resistor 135. Thus, with OUT low, the voltage developed across resistor 133 will be $+V_P/2$, and the voltage developed across resistor 135 will be $-V_P/2$. This is the same condition as was discussed in FIG. 8.

On the other hand, if the state of OUT is high, then transistors 165 and 167 will be on, and current sources 131 and 137 will be coupled to nodes 136 and 132, respectively, thus reversing the voltage polarity on nodes 132 and 136.

Figure 10A:
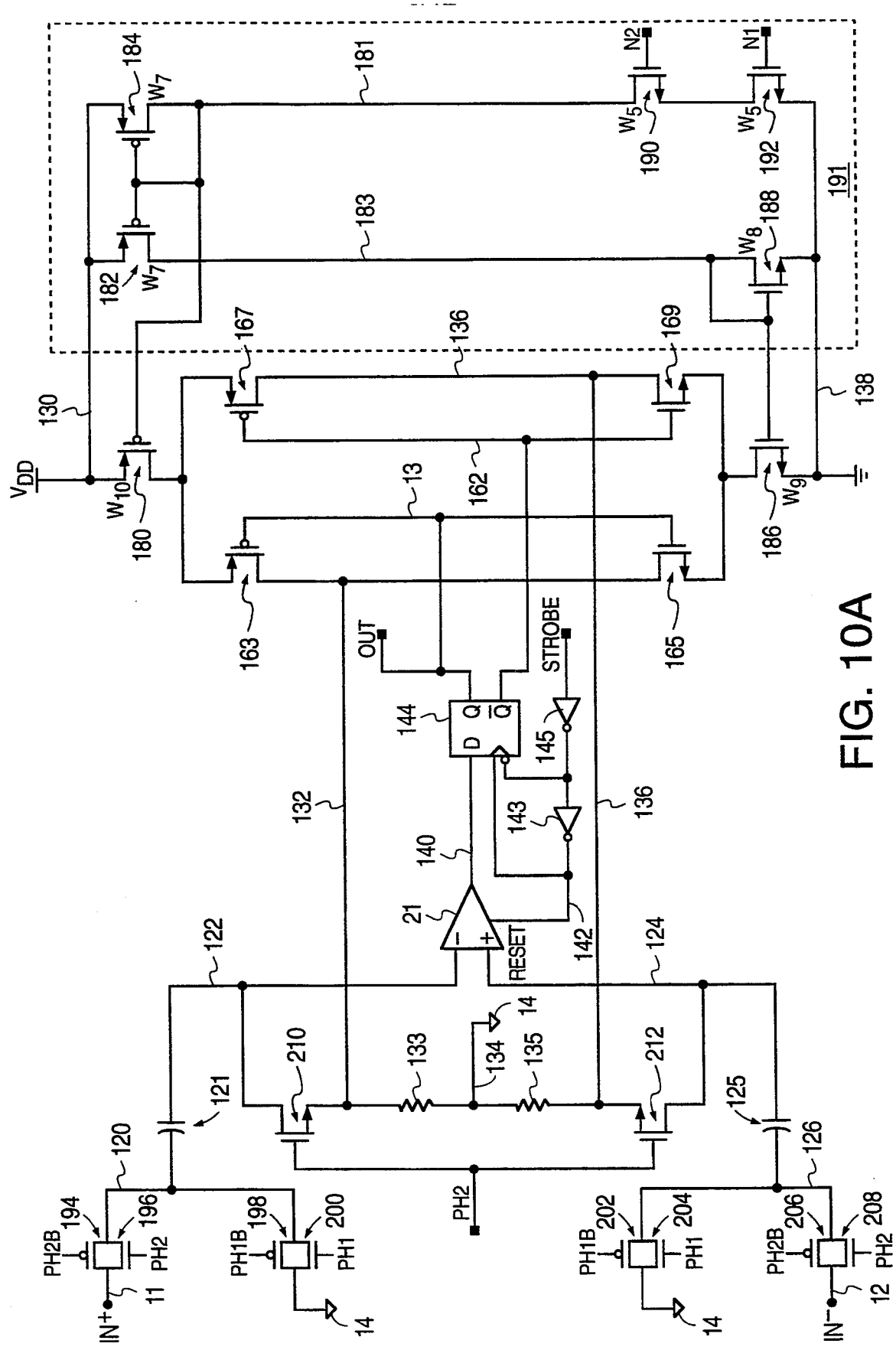
FIG. 10A is a schematic diagram of a hysteresis comparator of the current invention and shows an embodiment incorporating a fully differential hysteresis comparator.

A hysteresis comparator is shown in FIG. 10A which incorporates the conceptual aspects discussed in FIGS. 7-9 for offsetting the input voltage by the decision voltage. Furthermore, in conjunction with the circuitry of FIG. 10B, it maintains the decision voltage insensitivity to semiconductor process variations, the absence of any requirement for precise voltage references, and the PTAT characteristic of the decision voltages as does the embodiment of FIG. 6 above.

Referring to FIG. 10A, bias circuitry 191, driven by bias nodes N1 and N2, provide the necessary biasing on nodes 183 and 181 to generate two equal current sources comprising transistors 180 and 186. The currents generated by these two current sources are steered by transistors 163, 165, 167 and 169 into either of resistors 133 or 135, each connected to node 134 and coupled to comparator reference 14. These controlled currents from current sources 180 and 186, flowing through resistors 133 and 135 respectively, or alternatively flowing through resistors 135 and 133 respectively, will generate precise voltages on nodes 132 and 136 corresponding to plus and minus one-half of the decision voltages $V_P$ and $V_N$ desired for the hysteresis comparator. Power supply voltages $V_{DD}$ and $V_{SS}$ are used as BIAS$_1$ and BIAS$_2$ voltages and are coupled to nodes 130 and 138, respectively.

Two differential inputs are provided, IN+ coupled to lead 11 and IN− coupled to lead 12. Transistors 194, 196, 198 and 200 form two CMOS transfer gates which serve to couple node 120 to either the IN+ signal or to the comparator reference 14. Likewise, transistors 202, 204, 206 and 208 form two CMOS transfer gates and serve to couple node 126 to either IN− or to the comparator reference 14. Non-overlapping clock signals PH2 and PH1 (and their respective complements, PH2B and PH1B) control these four transfer gates. Capacitors 121 and 125, along with resistors 133 and 135, are used in the fashion outlined in FIG. 8 to produce a differential voltage onto input nodes 122 and 124 of gain stage 21 corresponding to the differential input voltage coupled to leads 11 and 12, offset by the decision voltage $V_P$ or $V_N$, which are then sampled by gain stage 21, which in this embodiment is a latching gain stage. The output 140 of gain stage 21 is further latched by latch 144 to generate true and complementary output signals 13 and 162 which serve to control the steering transistors 163, 165, 167, and 169 previously mentioned, and which provides the necessary feedback function to give rise to the hysteresis characteristic of this comparator.

The decision voltages can be generated very accurately and in such a fashion as to be insensitive to semiconductor process variations, in much the same way as for the circuitry of FIG. 6 described above. The current sources comprised of transistors 180 and 186 are controlled by bias circuit 191, and further controlled by the bias generator of FIG. 10B, so that the current produced, when passed through either resistor 133 or 135, generates a voltage which is insensitive to semiconductor process variations, which needs no precision reference voltages, and which is proportional to absolute temperature.

Figure 10B:
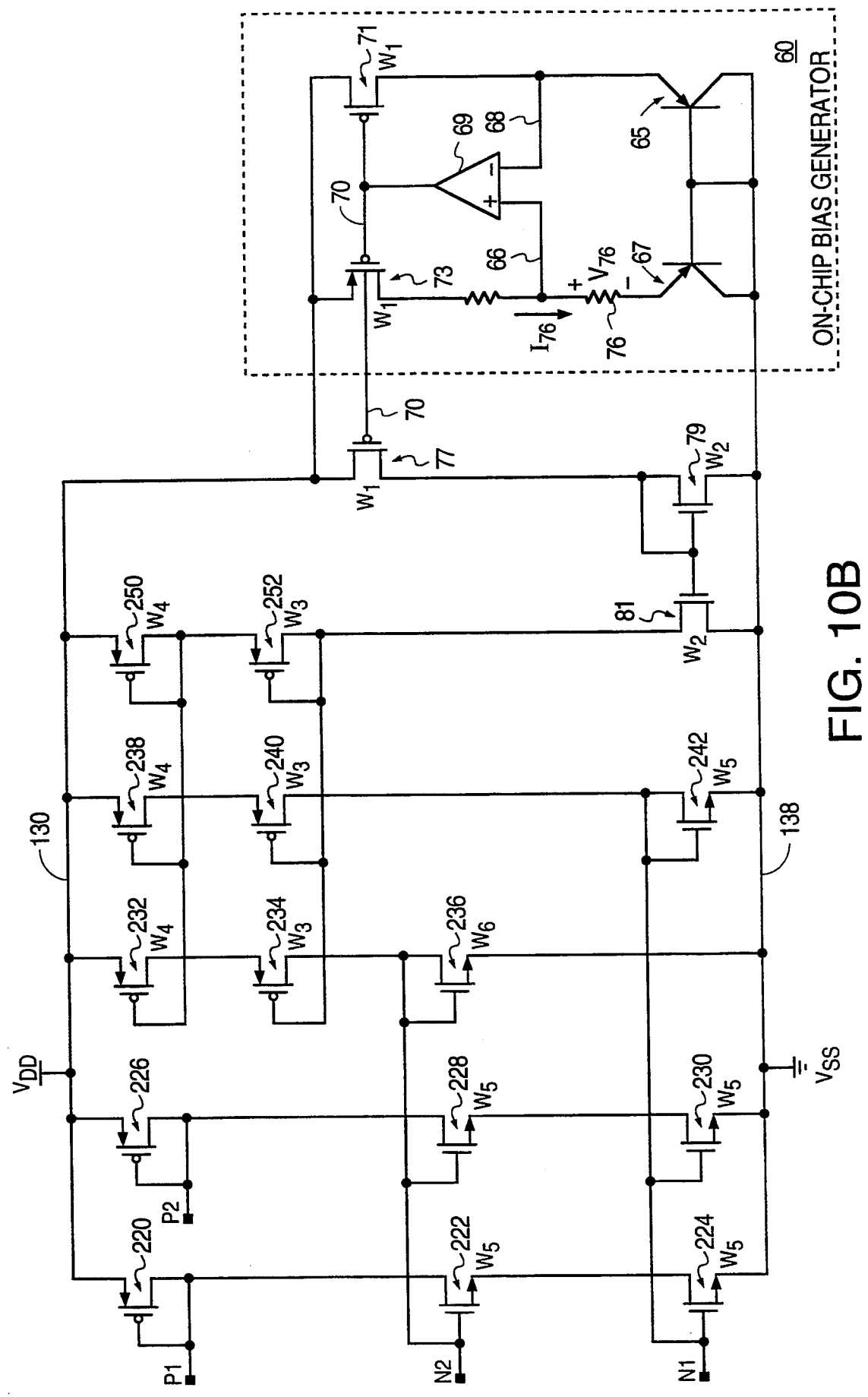
FIG. 10B is a schematic diagram of a bias circuit used in conjunction with the hysteresis comparator of FIG. 10A.

Bias nodes N1 and N2 are generated by the circuit of FIG. 10B. On-chip bias generator 60 forms a reference current source which is typically shared with other circuitry on the same integrated circuit. Bipolar transistors 67 and 65 have respective emitter areas of $A_{67}$ and $A_{65}$. Gain element 69 adjusts the voltage of node 70 so that the voltages of nodes 66 and 68 are equilibrated. Matched P-channel transistors 71 and 73, both of width $W_1$ and driven by node 70, source equal currents to transistors 65 and 67, respectively. Thus, the current through resistor 76, $I_{76}$, can be represented as:

$$I_{76} = \frac{V_{76}}{R_{76}} = \frac{\frac{kT}{q} \ln \frac{A_{67}}{A_{65}}}{R_{76}} \qquad \text{(eq. 5)}$$

Since the current through transistor 73, $I_{73}$, is the same current which flows through resistor 76, $I_{73}$ will be equal to $I_{76}$. Transistor 77, also of width $W_1$, is matched to transistor 73 (and to transistor 71) and will conduct a current equal to $I_{76}$, since it is biased identically to transistor 73 and is the same width.

Transistors 79 and 81, both of width $W_2$, form a current mirror and will cause the current through transistor 81, $I_{81}$, to equal the current through transistor 77, $I_{77}$, which has been shown above to equal $I_{76}$. P-channel transistors 232, 238, and 250, each of width $W_4$, and P-channel transistors 234, 240, and 252, each of width $W_3$, form current mirrors which cause the current through transistor 236, of width $W_6$, and through transistor 242, of width $W_5$, to both equal $I_{76}$. The series combinations of transistors 250 and 252, transistors 238 and 240, and transistors 232 and 234 in the current mirror produce mirrored currents through transistors 236 and 242, $I_{236}$ and $I_{242}$, that are more ideally matched to $I_{76}$. Bias nodes N1 and N2 are generated at the drains of transistors 242 and 236, respectively. The second bias node, N2, allows use of two series N-channel devices in a well known cascode configuration to produce a more ideal current source, an example of which is shown by transistors 228 and 230, where the voltage at N2 biases transistor 230 in the saturation region when the ratio $W_5/W_6$ is greater than 4. Finally, $V_{DD}$-referenced bias nodes P1 and P2 are generated by N1 and N2 driving two mirror circuits comprising transistors 220, 222, and 224, and transistors 226, 228, and 230. Bias voltages N1, N2, P1, and P2 are typically shared by other circuit blocks residing on the same integrated circuit.

Referring to FIG. 10A, bias node N1 is coupled to transistor 192, of width $W_5$, whereas bias node N2 is coupled to transistor 190, of width $W_5$, which will cause the current through transistor 192 to equal $I_{76}$. Transistors 182 and 184, both of width $W_7$, and transistor 188, of width $W_8$, will also conduct a current equal to $I_{76}$ due to their current mirror configuration. Lastly, P-channel transistor 180, of width $W_{10}$, is driven by the same node 181 which biases transistor 184 and therefore mirrors a current, $I_{180}$, equal to the ratio $W_{10}/W_7$ times the current through transistor 184. Likewise, transistor 186, of width $W_9$, mirrors the current through transistor 188 and thus will generate a current, $I_{186}$, equal to the ratio $W_9/W_8$ times the current through transistor 188.

Assuming that PH2 is low, that OUT is low, and that transistor 163 couples current source transistor 180 to resistor 133, and further that transistor 169 couples current source transistor 186 to resistor 135, the voltages on nodes 132 and 136 can be written as follows:

$$V_{132} = \left[ \frac{W_{10}}{W_7} \frac{R_{133}}{R_{76}} \frac{k}{q} \ln \frac{A_{67}}{A_{65}} \right] \cdot T \qquad \text{(eq. 16)}$$

$$V_{136} = -\left[ \frac{W_9}{W_8} \frac{R_{135}}{R_{76}} \frac{k}{q} \ln \frac{A_{67}}{A_{65}} \right] \cdot T \qquad \text{(eq. 17)}$$

With careful attention to matching of like structures in the layout, the voltages generated at nodes 132 and 136 are independent of semiconductor process variations and are proportional to absolute temperature. Furthermore, by choosing the proper resistor ratios and current mirror ratios, a wide range of voltages can be implemented.

Figure 11:
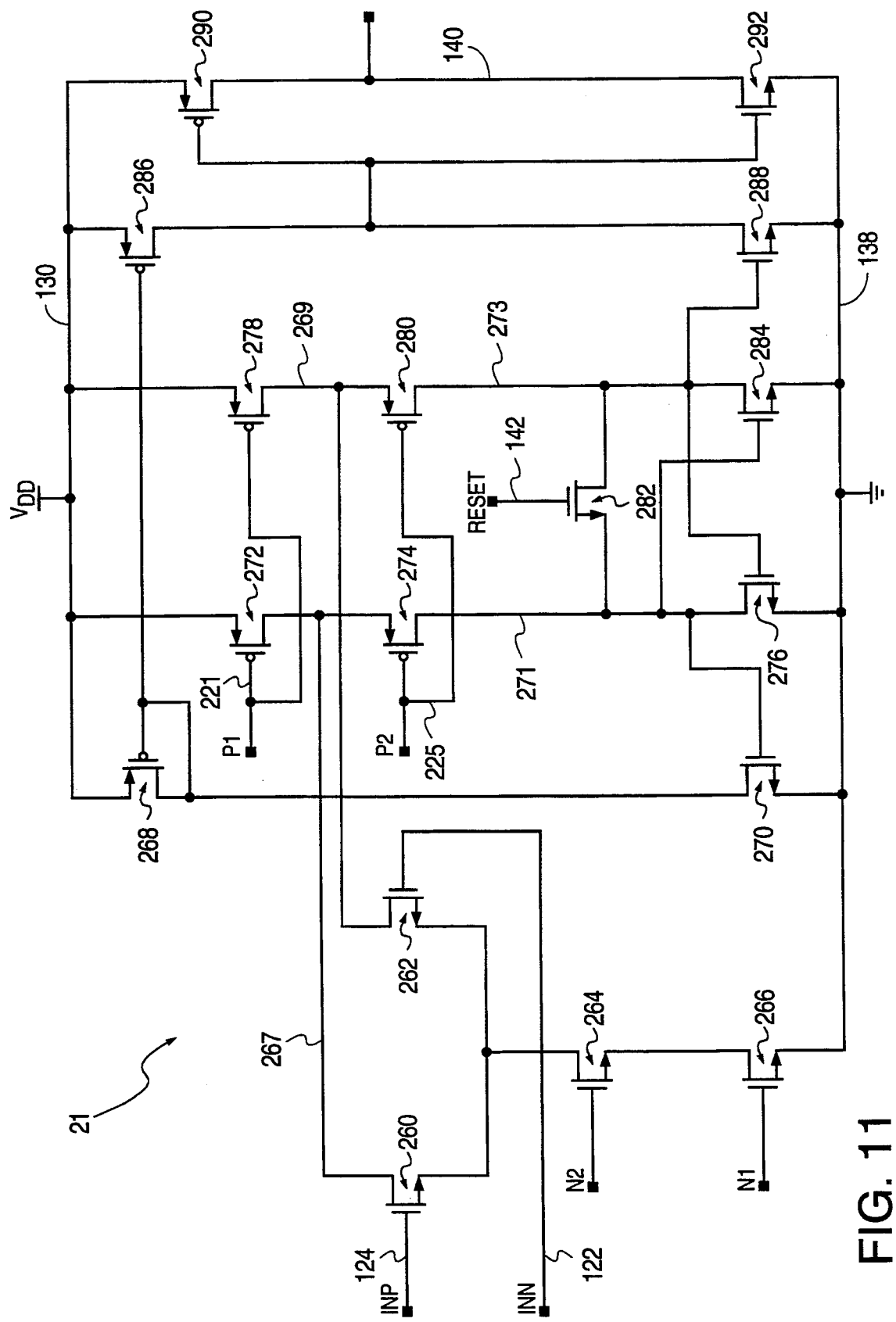
FIG. 11 is a schematic diagram of a gain stage useful to the hysteresis comparator of FIG. 10A.

An embodiment of the latching gain stage 21 is shown in FIG. 11. An input differential pair comprised of transistors 260 and 262 forms a differential amplifier responsive to the voltage present on input nodes 124 and 122. Bias nodes N1 and N2 described earlier are utilized to drive a current tail comprising transistors 264 and 266. Bias nodes P1 and P2 are coupled to nodes 221 and 225 respectively and serve to set the magnitude of current in load transistors 272, 274, 278 and 280.

In operation differential nodes 271 and 273 are equilibrated by transistor 282 in order to reset the flip-flop inherent within the output stage of this circuit. Biased by node P1, transistors 272 and 278 act as constant current loads and source current into nodes 267 and 269, respectively. Since the differential transistors 260 and 262 will split the tail current corresponding to the voltage level of the input nodes 122 and 124, the net current flow through transistors 260 and 262 will depend upon the input voltages. The current flow through transistor 274 is equal to the current through transistor 272, less that through transistor 260. Likewise, the current flow through transistor 280 is equal to the current through transistor 278, less that through transistor 262. While node 142 (which is a RESET control) is high and thus transistor 282 is on, nodes 271 and 273 are maintained at a voltage somewhat above the N-channel threshhold voltage. Consequently, transistors 290 and 292 in the output stage will be biased so that both are somewhat conductive, and a mid-level output voltage will be generated.

When the gate drive on transistor 282 falls (node 142 goes low), the different current levels through transistors 274 and 280 will cause either node 271 or node 273 to rise, and the other to fall. Cross-coupled transistors 276 and 284 will latch, thus allowing the rising node to rise all the way to near $V_{DD}$, while pulling the falling node to ground. A differential to single-ended conversion is provided by transistors 270, 288, 268, and 286, followed by a simple inverter to generate output node 140.

Figure 12:
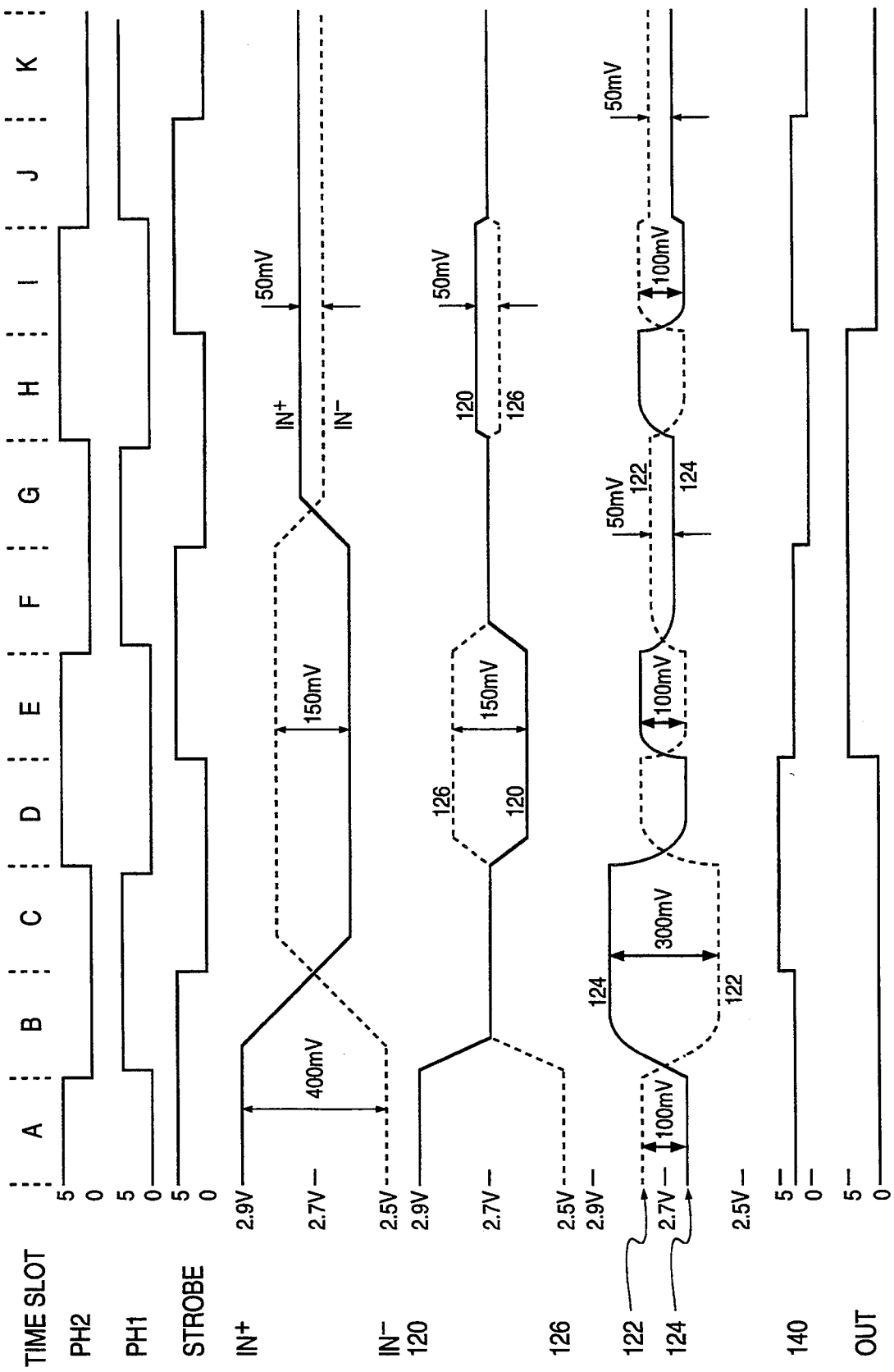
FIG. 12 is a diagram of electrical waveforms corresponding to the operation of the hysteresis comparator of FIG. 10A.

FIG. 12 highlights the operation of the hysteresis comparator of FIG. 10, by showing the waveforms of several keys circuit nodes throughout three sampling cycles. Timeslots A-K are indicated to aid in the operating description.

Referring to timeslot A, clock signal PH2 is high, clock signal PH1 is low, STROBE is high, and OUT is low. The inputs to the comparator, IN+ and IN−, show a +400 mV signal. Because PH2 is high, the IN+ voltage is coupled to node 120, and the IN− voltage is coupled to node 126. Because OUT is low, transistor 163 is on, and the current through current source transistor 180 will flow through resistor 133 to comparator reference 14. Likewise, transistor 169 is also on, and will cause current flow from comparator reference 14, through resistor 135, and through current source transistor 186. These two current sources are controlled to impress a precise voltage on nodes 132 and 136 of one-half of the decision voltage $V_P$ or $V_N$, with polarity controlled by the state of OUT from the last sample. In the example of FIG. 12, the decision voltage $V_P$ is $+100$ mV and $V_N$ is $-100$ mV. Assuming the comparator reference 14 is arbitrarily at a potential of 2.7 volts, node 132 will then be at 2.750 volts, and node 136 at 2,650 volts. While the differential operation of this circuit may be easier to follow with a reference level chosen between the input voltages, the circuit operates equally well with a reference voltage chosen within a wide range, and not necessarily between the expected input voltages.

Because PH2 is high and transistors 210 and 212 are on, the voltages of nodes 132 and 136 will be imparted to nodes 122 and 124, respectively, which are the input nodes to gain stage 21.

Because STROBE is high, the RESET input of gain stage 21, which is node 142, is also high, being generated by inverters 145 and 143 from the STROBE signal. Consequently, output 140 of gain stage 21 is at a mid-level voltage, due to the cross-coupled transistors 276 and 284 (FIG. 12) being held in a reset state and biasing both output pullup transistor 290 and output pulldown transistor 292 in a conductove state.

Timeslot B occurs when PH2 goes low, and subsequently PH1 goes high. Capacitors 121 and 125 are decoupled now from IN+ and IN−, respectively, and are now coupled to comparator reference 14. Nodes 120 and 126 are both driven to the potential of comparator reference 14, or 2.7 V in this example. Since transistor 210 is off, when node 120 falls, node 122 is free to follow, being coupled by capacitor 121. Since the stray capacitance on node 122 is neglible compared to the value of capacitor 121, and since the input impedance of gain stage 21 is very high, when node 120 falls by 200 mV, node 122 will be coupled by virtually the same 200 mV. Likewise, as node 126 is driven to the comparator reference 14 voltage by PH1, node 124 is coupled upward by 200 mV.

At the end of timeslot B, for a differential input voltage between IN+ and IN− of +400 mV, we have a generated a differential voltage seen by gain stage 21 of +100 mV less (corresponding to the decision voltage $V_P$), or +300 mV remaining between nodes 124 and 122, with node 124 being at a higher voltage.

Timeslot C occurs when STROBE falls. This generates a falling node 142 which releases the gain stage 21, and allows the sensing of nodes 122 and 124. Since the voltage of node 124 is higher than that of node 122, the output 140 of gain stage 21 is driven high. This gain stage is a latching circuit which is held in a reset condition while node 142 is high, and only responds to input conditions immediately after node 142 falls.

Timeslot D occurs when PH1 falls and PH2 rises, and resets the input transfer gates in preparation for a new sampling cycle. Even though the polarity of the input nodes 122 and 124 reverses, gain stage 21 output node 140 remains high because of the latching characteristic of this gain stage. Because the transfer gate comprised of transistors 194 and 196 is now on, node 120 will charge to the voltage of input IN+, or 2,625 V. Likewise, node 126 will charge to the voltage of input IN−, or 2.775 V, through the transfer gate comprised of transistors 206 and 208. Since the inputs IN+ and IN− have changed since timeslot A, notice that node 126 is now higher in voltage than node 120. Also, since OUT is still low, the voltage of nodes 122 and 124 will reestablish at the same values as during timeslot A.

Timeslot E occurs when STROBE goes high. The output node 140 of gain stage 21 is then latched by latch 144, causing OUT to go high. Additionally, the gain stage 21 itself is reset, which causes its output 140 to return to its mid-level reset voltage.

With OUT now high, transistors 165 and 167 are now on, and transistors 163 and 169 are now off. The current through current source transistor 180 will now flow through resistor 135 and will generate a positive voltage on node 136 with respect to comparator reference 14. Likewise, current will now flow from comparator reference 14, through resistor 133, and through current source transistor 186, and will generate a negative voltage on node 132 with respect to comparator reference 14. With PH2 high and transistors 210 and 212 on, node 122 is charged to the voltage of node 132, and node 124 is charged to the voltage of node 136. With the reference level of 2.7 V, the voltage of node 122 is therefore 2.65 V, and node 124 is 2.75 V.

Timeslot F occurs when PH2 goes low, and subsequently PH1 goes high. As in timeslot B before, capacitors 121 and 125 are decoupled now from IN+ and IN−, respectively, and are now coupled to comparator reference 14. Nodes 120 and 126 are both driven to the potential of comparator reference 14, or 2.7 V in this example. As node 126 is driven downward in voltage, a downward coupling is induced upon node 124 by capacitor 125. Similarly, node 122 is coupled upward by capacitor 121 following node 120.

At the end of timeslot F, for a differential input voltage between IN+ and IN− of −150 mV, we have a generated a differential voltage seen by gain stage 21 of 100 mV more (corresponding to the decision voltage $V_N$), or −50 mV remaining between nodes 124 and 122, with node 122 being at a higher voltage.

Timeslot G occurs when STROBE falls. This again generates a falling node 142 which releases the gain stage 21, and allows the sensing of nodes 122 and 124 and the driving and latching of output node 140. Since the voltage of node 122 is higher than that of node 124, the output 140 of gain stage 21 is driven low.

An example of the operation of this hysteresis comparator when the input voltage is less than the decision voltage necessary to cause switching is shown in timeslots H-K. The differential input voltage (IN+ - IN−) has changed from −150 mV during timeslots C-F to +50 mV, which is less than the positive decision voltage $V_P$ of 100 mV (for this example).

During timeslots H and I, the voltages of nodes 120 and 126 are being charged to the input voltages, as before. During timeslot J, nodes 120 and 126 are driven to the voltage level of comparator reference 14. Since the change in voltage for node 120 is −25 mV, node 122 is coupled only −25 mV from its earlier voltage of 2.750 V, resulting in a final voltage of 2.725 V. Likewise, node 124 is coupled up +25 mV to a final voltage of 2,675 V. When STROBE falls during timeslot K, the gain stage responds to a negative differential input voltage on nodes 122 and 124, and output node 140 is driven low. Since the differential input voltage on node IN+ and IN⁻ equal to 50 mV did not exceed the decision voltage Vp of 100 mV, the output 140 was driven low, and would generate a low OUT when STROBE would next go high.

As mentioned before, the choice of voltage level on comparator reference 14 is not critical. The basic requirement for this embodiment on the voltage level of comparator reference 14 is that the transfer gate switches need to be properly turned on and off. That is, transfer gates comprising transistors 194, 196, 198, 200, 202, 204, 206, and 208, and transistors 210 and 212 must be properly switched on and off by the high and low voltages levels of signals PH2, PH2B, PH1, and PH1B applied to the gates of these transistors.

There are other embodiments of this invention, which may differ from the implementation shown in FIGS. 10A and 10B, but which nonetheless incorporate the subject matter of this invention. For instance, the rising edge of STROBE could be aligned with the rising edge of PH2. This would effectively eliminate the timeslots D and H, but circuit operation would be virtually identical. Also, the polarity of input connections to gain stage 21 and output connections from the latch 144 can be reversed while preserving overall comparator operation. There are many possible variations in the gain stage, in the exact biasing circuitry, and in clocking sequences, which nontheless embody the concepts described above.

While the invention has been described with respect to the embodiments set forth above, the invention is not necessarily limited to these embodiments. Accordingly, other embodiments, variations, and improvements not described herein are not necessarily excluded from the scope of the invention, which is defined by the following claims.

I claim:

1. A hysteresis comparator having first and second decision voltages comprising:

a high gain circuit having a first input, a second input, and an output having first and second output states responsive to the polarity of a voltage difference across said first and second inputs;

a resistor circuit;

a current source circuit coupled to said output of said high gain circuit, and further coupled to said resistor circuit for maintaining across said resistor circuit, independently of semiconductor process variations, a voltage corresponding to said first decision voltage in response to said first output state of said high gain circuit, and corresponding to said second decision voltage in response to said second output state of said high gain circuit; and means for imposing a voltage across said first and second inputs of said high gain circuit that is linearly related to an input voltage of said hysteresis comparator and to said voltage across said resistor circuit;

wherein said resistor circuit comprises a first resistor having a first terminal coupled to the first input of said high gain circuit and a second terminal coupled to a common node, and a second resistor having a first terminal coupled to the second input of said high gain circuit and a second terminal coupled to said common node;

wherein said current circuit comprises first and second current sources, said first current source having a first terminal coupled to a first bias lead, and a second terminal coupled to said first terminal of said first resistor, and said second current source having a first terminal coupled to a second bias lead, and a second terminal coupled to said first terminal of said second resistor; and wherein the input voltage is a differential signal and said input voltage imposing means comprises a first conductor coupled to said first input of said high gain circuit and a second conductor coupled to said second input of said high gain circuit, said first and second conductors for conveying the differential signal thereto.

2. A hysteresis comparator as in claim 1, wherein said current circuit further comprises control means to regulate and first and second current sources such that said voltage across said resistor circuit impressed by each of said first and second current sources is proportional to absolute temperature, wherein the proportionality constant is determined exclusively by physical constants, the ratios of like semiconductor devices, and mathematical operations thereupon.

3. A hysteresis comparator as in claim 1, further comprising:

a first switched capacitor circuit for operatively connecting the first terminal of said first resistor to the first input of said high gain circuit at first times, and operatively disconnecting the first terminal of said first resistor from the first input of said high gain circuit at second times different from said first times; and for operatively connecting said first conductor to said first input of said high gain stage through a first capacitor at said first times, and operatively disconnecting said first conductor from said first capacitor at said second times; and for operatively connecting said first capacitor to said common node at said second times, and operatively disconnecting said first capacitor from said common node at said first times; and a second switched capacitor circuit for operatively connecting the first terminal of said second resistor to the second input of said high gain circuit at said first times, and operatively disconnecting the first terminal of said second resistor from the second input of said high gain circuit at said second times; and for operatively connecting said second conductor to said second input of said high gain stage through a second capacitor at said first times, and operatively disconnecting said second conductor from said second capacitor at said second times; and for operatively connecting said second capacitor to said common node at said second times, and operatively disconnecting said second capacitor from said common node at said first times; and means for latching the state of said output of said high gain circuit at said second times.

4. A hysteresis comparator comprising:

a gain stage having first and second inputs, and an output which can be driven to either a first state or a second state in response to the voltages present at the first and second inputs;

a resistor having a first terminal coupled to the first input of the gain stage, and further having a second terminal coupled to a reference lead;

a first current source coupled between a first bias lead and the first terminal of the resistor;

a second current source coupled between a second bias lead and the first terminal of the resistor;

a first input lead for receiving one polarity of a differential voltage, coupled to the second input of the gain stage; and a second input lead for receiving the other polarity of the differential voltage, coupled to the reference lead;

wherein the first current source comprises a P-channel transistor;

wherein the second current source comprises an N-channel transistor; said hysteresis comparator further comprising:

a first switch coupling the gate terminal of the P-channel transistor to a first control node;

a second switch coupling the gate terminal of the P-channel transistor to the first bias lead;

a third switch coupling the gate terminal of the N-channel transistor to a second control node;

a fourth switch coupling the gate terminal of the N-channel transistor to the second bias lead;

means for closing the first and fourth switches and opening the second and third switches in response to the first output state of the gain stage, thereby enabling the first current source and disabling the second current source; and for opening the first and fourth switches and closing the second and third switches in response to the second output state of the gain stage, thereby disabling the first current source and enabling the second current source; and means for generating the first and second control nodes such that a voltage across the resistor impressed by each of the first and second current sources is proportional to absolute temperature, wherein the proportionally constant is determined exclusively by physical constants, the ratios of like semiconductor devices, and mathematical operations thereupon.

5. A hysteresis comparator having both positive and negative decision voltages, comprising:

a gain stage having an inverting input coupled to a non-inverting input lead, a non-inverting input, and an output coupled to an output lead, wherein the output will be driven to a high state if a voltage present on the non-inverting input exceeds a voltage present on the inverting input, and wherein the output will be driven to a low state if a voltage present on the inverting input exceeds a voltage present on the non-inverting input;

a resistor having a first terminal coupled to the non-inverting input of the gain stage, and further having a second terminal coupled to a reference lead;

an inverting input lead coupled to the reference lead;

a P-channel transistor coupled between a positive bias lead and the first terminal of the resistor;

an N-channel transistor coupled between a negative bias lead and the first terminal of the resistor;

a first transfer gate coupling the gate terminal of the P-channel transistor to a first control node;

a second transfer gate coupling the gate terminal of the P-channel transistor to the positive bias lead;

a third transfer gate coupling the gate terminal of the n-channel transistor to a second control node;

a fourth transfer gate coupling the gate terminal of the N-channel transistor to the negative bias lead;

means for closing the first and fourth transfer gates and for opening the second and third transfer gates in response to a high output state of the gain stage, and further for opening the first and fourth transfer gates and closing the second and third transfer gates in response to a low output state of the gain stage.

means for generating a voltage on each of the first and second control nodes such that a voltage across the resistor impressed by each of the P-channel and N-channel transistors is proportional to absolute temperature, wherein the proportionality constant is determined exclusively by physical constants, the ratios of like semiconductor devices, and mathematical operations thereupon.

6. A hysteresis comparator comprising:

a gain stage having first and second inputs, and an output coupled to an output lead which can be driven to a first state when the voltage present on the first input exceeds the voltage present on the second input, and to a second state when the voltage present on the second input exceeds the voltage present on the first input;

a resistor having a first terminal, and further having a second terminal coupled to a reference lead;

a current source having a first terminal coupled to a first bias lead, and further having a second terminal coupled to the first terminal of the resistor;

a capacitor having a first terminal, and further having a second terminal coupled to the first input of the gain stage;

a first switch coupling, when in a first position, a first input lead to the first terminal of the capacitor and alternately coupling, when in a second position, the first terminal of the capacitor to the reference lead;

a second switch coupling, when in a first position, the second terminal of the capacitor to the first terminal of the resistor, said second switch having a second position; and a first conductor coupling a second input lead to both the second input of the gain stage and to the reference lead.

7. A hysteresis comparator as in claim 6 and further comprising means for positioning the first and second switches into respective first positions at first times, and into respective second positions at second times different from the first times.

8. A hysteresis comparator as in claim 7 and further comprising means for latching the output state of the gain stage at the second times.

9. A hysteresis comparator as in claim 8 and further comprising means for controlling the direction of current flow through the resistor in accordance with the output state of the gain stage.

10. A hysteresis comparator comprising:

a gain stage having first and second inputs, and an output which can be driven to a first state when the voltage present on the first input exceeds the voltage present on the second input, and to a second state when the voltage present on the second input exceeds the voltage present on the first input;

a first capacitor having a first terminal, and further having a second terminal coupled to the first input of the gain stage;

a second capacitor having a first terminal, and further having a second terminal coupled to the second input of the gain stage;

a first switch coupling, when in a first position, a non-inverting input lead to the first terminal of the first capacitor and alternately coupling, when in a second position, the first terminal of the first capacitor to a reference lead;

a second switch coupling, when in a first position, an inverting input lead to the first terminal of the second capacitor and alternately coupling, when in a second position, the first terminal of the second capacitor to the reference lead;

a first resistor having a first terminal, and further having a second terminal coupled to the reference lead;

a second resistor having a first terminal, and further having a second terminal coupled to the reference lead;

a third switch coupling, when in a first position, the first input of the gain stage to the first terminal of the first resistor, said third switch having a second position;

a fourth switch coupling, when in a first position, the second input of the gain stage to the first terminal of the second resistor, said fourth switch having a second position;

a first current source having a first terminal coupled to a first bias lead, and further having a second terminal coupled to the first terminal of the first resistor; and a second current source having a first terminal coupled to a second bias lead, and further having a second terminal coupled to the first terminal of the second resistor.

11. A hysteresis comparator as in claim 10 and further comprising control means for positioning the first, second, third, and fourth switches into respective first positions at first times, and into respective second positions at second times different from the first times.

12. A hysteresis comparator as in claim 11 and further comprising means for latching the output state of the gain stage at the second times.

13. A hysteresis comparator as in claim 12 and further comprising steering means for controlling the direction of current flow through the first and second resistors in accordance with the output state of the gain stage.

14. A hysteresis comparator as in claim 13 wherein the steering means further comprises:

a fifth switch coupling the second terminal of the first current source to the first terminal of the first resistor;

an sixth switch coupling the second terminal of the second current source to the first terminal of the first resistor;

a seventh switch coupling the second terminal of the first current source to the first terminal of the second resistor;

a eighth switch coupling the second terminal of the second current source to the first terminal of the second resistor; and means for closing the fifth and eighth switches and opening the sixth and seventh switches in response to the first output state of the gain stage, and for opening the fifth and eighth switches and closing the sixth and seventh switches in response to the second output state of the gain stage.

15. A hysteresis comparator responsive to complementary non-overlapping first and second clock phases, comprising:

a gain stage having inverting and non-inverting inputs, and an output which can be driven to a low state when the voltage present on the inverting input exceeds the voltage present on the non-inverting input, and to a high state when the voltage present on the non-inverting input exceeds the voltage present on the inverting input;

a latch having an input coupled to the output of the gain stage, a true output coupled to an output lead, a complementary output, and a clock input;

a first capacitor having a first terminal, and further having a second terminal coupled to the inverting input of the gain stage;

a second capacitor having a first terminal, and further having a second terminal coupled to the non-inverting input of the gain stage;

a first transfer gate, controlled by the second clock phase, coupling a non-inverting input lead to the first terminal of the first capacitor;

a second transfer gate, controlled by the first clock phase, coupling the first terminal of the first capacitor to a reference lead;

a third transfer gate, controlled by the second clock phase, coupling an inverting input lead to the first terminal of the second capacitor;

a fourth transfer gate, controlled by the first clock phase, coupling the first terminal of the second capacitor to the reference lead;

a first resistor having a first terminal, and further having a second terminal coupled to the reference lead;

a second resistor having a first terminal, and further having a second terminal coupled to the reference lead;

a first N-channel transistor coupling the inverting input of the gain stage to the first terminal of the first resistor, having a gate terminal coupled to the second clock phase;

a second N-channel transistor coupling the non-inverting input of the gain stage to the first terminal of the second resistor, having a gate terminal coupled to the second clock phase;

a first current source comprising a first P-channel transistor having a source terminal coupled to a first bias lead, having a gate terminal coupled to a first control node, and further having a drain terminal;

a second current source comprising an third N-channel transistor having a source terminal coupled to a second bias lead, having a gate terminal coupled to a second control node, and further having a drain terminal;

a second P-channel transistor coupling the drain terminal of the first P-channel transistor to the first terminal of the first resistor, having a gate terminal coupled to the true output of the latch;

a fourth N-channel transistor coupling the drain terminal of the second current source to the first terminal of the first resistor, having a gate terminal coupled to the complementary output of the latch;

a third P-channel transistor coupling the drain terminal of the first P-channel transistor to the first terminal of the second resistor, having a gate terminal coupled to the complementary output of the latch;

a fifth N-channel transistor coupling the drain terminal of the second current source to the first terminal of the second resistor, having a gate terminal coupled to the true output of the latch; and means for generating the first and second control nodes such that a voltage across the first and second resistors impressed by each of the first and second current sources is proportional to absolute temperature, wherein the proportionality constant is determined exclusively by physical constants, the ratios of like semiconductor devices, and mathematical operations thereupon.

* * * * *